United States Patent [19]

Gorecki et al.

[11] Patent Number: 5,159,205
[45] Date of Patent: Oct. 27, 1992

[54] TIMING GENERATOR CIRCUIT INCLUDING ADJUSTABLE TAPPED DELAY LINE WITHIN PHASE LOCK LOOP TO CONTROL TIMING OF SIGNALS IN THE TAPPED DELAY LINE

[75] Inventors: James L. Gorecki, Vail; Michael J. McGowan, Tuscon, both of Ariz.

[73] Assignee: Burr-Brown Corporation, Tucson, Ariz.

[21] Appl. No.: 603,900

[22] Filed: Oct. 24, 1990

[51] Int. Cl.⁵ .................. H03K 5/159; H03K 7/00; H03K 3/01; H03K 17/00

[52] U.S. Cl. .................... 307/269; 307/594; 307/595; 307/597; 307/601; 307/602; 307/603; 307/605; 307/606; 328/55; 328/63; 328/66; 328/72

[58] Field of Search ............... 307/601, 603, 605, 606, 307/590, 597, 602, 594, 595; 328/55, 66, 155, 63, 72

[56] References Cited

U.S. PATENT DOCUMENTS

| | | | |
|---|---|---|---|
| 3,206,686 | 9/1965 | Goor | 328/155 |
| 3,305,798 | 2/1967 | Rappeport | 333/18 |
| 3,781,470 | 12/1973 | Horn | 178/7.3 R |
| 3,809,923 | 5/1974 | Esser | 307/221 |
| 3,883,810 | 5/1975 | Tacussel | 328/155 |
| 4,328,588 | 5/1982 | Smithson | 375/106 |
| 4,479,216 | 10/1984 | Krambeck et al. | 371/61 |
| 4,494,021 | 1/1985 | Bell et al. | 307/591 |
| 4,623,805 | 11/1986 | Flora et al. | 307/606 |
| 4,639,780 | 1/1987 | Willis | 358/150 |
| 4,658,161 | 4/1987 | Spencer | 307/603 |
| 4,698,829 | 10/1987 | Di Giulio | 307/606 |
| 4,769,755 | 9/1988 | Yamakawa | 364/413.24 |
| 4,795,985 | 1/1989 | Gailbreath, Jr. | 328/155 |
| 4,862,020 | 8/1989 | Cowan et al. | 307/601 |
| 5,013,944 | 5/1991 | Fischer et al. | 307/606 |

Primary Examiner—Janice A. Howell
Assistant Examiner—Trong Phan
Attorney, Agent, or Firm—Cahill, Sutton & Thomas

[57] ABSTRACT

A circuit for generating a plurality of timing signals includes a plurality of cascade-connected delay cells, each having an input coupled to an output of another, and a plurality of latches. Set inputs of various latches are coupled to outputs of various delay cells to determine times of occurrence of leading edges of various timing pulses. Reset inputs of the various latches are coupled to outputs of various delay cells to determine times of occurrence of trailing edges of various timing pulses. The circuit includes a phase detector having a first input coupled to receive a clock signal and a second input coupled to an output of one of the delay cells to receive a signal indicative of propagation of a logic state through a first group of the delay cells, to produce an adjustment signal indicative of whether the phase of the indicator signal is ahead of or behind the phase of the clock signal. Each of the delay cells increases or decreases propagation time through that delay cell in response to the adjustment signal, so as to cause a time required for the logic state to propagate through all of the delay cells to be equal to a period of the clock signal.

17 Claims, 4 Drawing Sheets

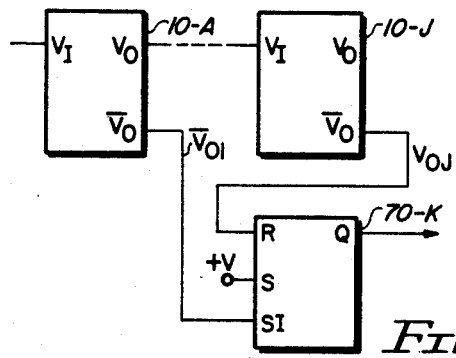
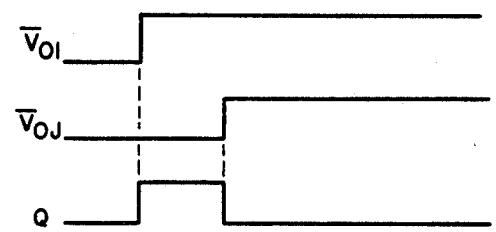
FIG.1A          FIG.1B
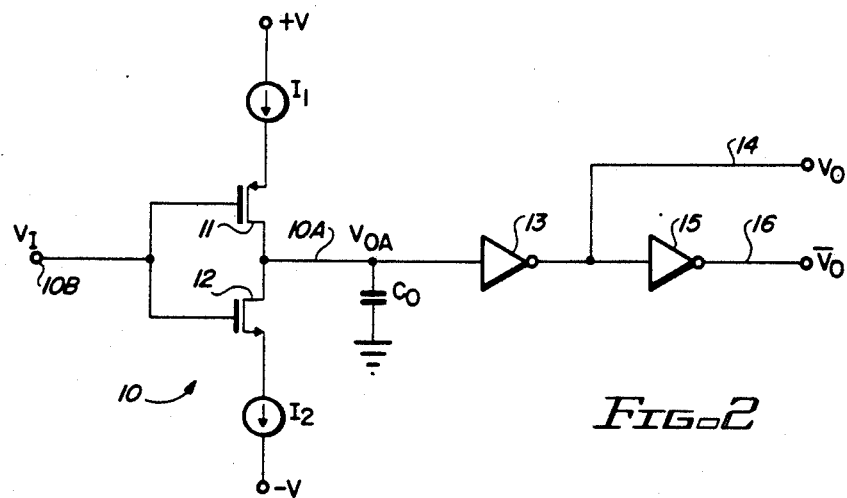
FIG.2
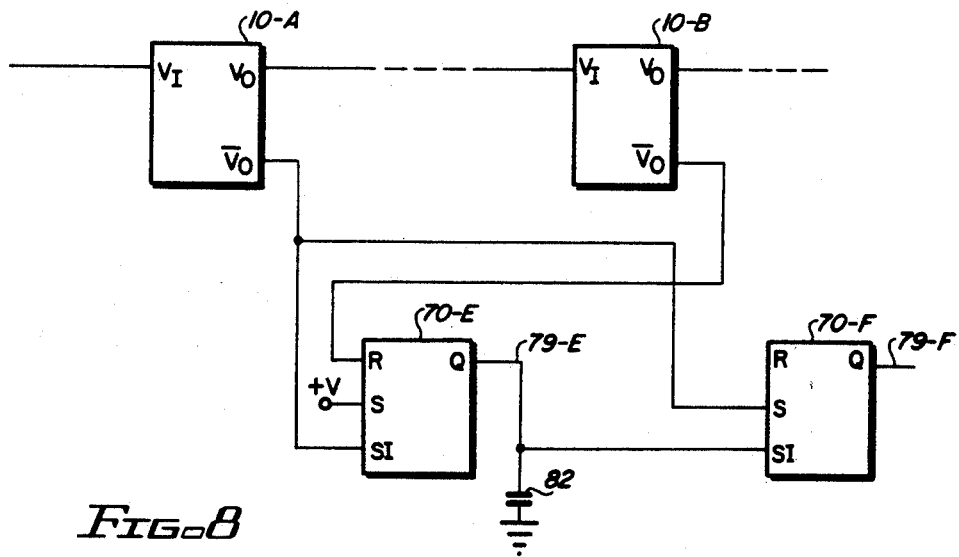
FIG.8

TIMING GENERATOR CIRCUIT INCLUDING ADJUSTABLE TAPPED DELAY LINE WITHIN PHASE LOCK LOOP TO CONTROL TIMING OF SIGNALS IN THE TAPPED DELAY LINE

BACKGROUND OF THE INVENTION

The invention relates to a circuit for generating a plurality of related timing signals, and particularly to such a circuit that does not require a high frequency clock signal from which the timing signals must be derived in order to obtain high resolution of edges of the timing signals.

All digital electronic systems require timing generator circuits to generate the various digital clock signals that are required to keep different digital elements synchronized. Such digital timing generator circuits generally include various connections of logic gates, flip-flops, digital delay elements, programmed logic arrays, and/or microprocessors. A problem is that all of the timing signals which are derived from such digital timing circuitry must be multiples of a "master" input clock frequency. Therefore, if high resolution is required for leading and/or trailing edges of timing signals generated by the prior timing generator circuits, very high frequency clock signals are required. Such high frequency clock signals, when they appear on printed circuit board conductors, couple noise onto other printed circuit board conductors. This may produce a need for electrical shielding that substantially increases the cost of the printed circuit board. Furthermore, it is difficult to transmit high frequency clock signals around a printed circuit board because various parasitic RC time constants associated therewith result in degrading the clock signal. Furthermore, master clock circuits for producing clock frequencies above 10-15 megahertz are expensive (the higher the frequency, the greater the expense), and clock frequencies greater than 15 megahertz may be needed for many applications. For example, at the present state of the CMOS technology, it is impractical or at least expensive and difficult to achieve internally generated timing signals with high accuracy. Another problem in typical circuits used to generate high accuracy, high speed timing pulse signals is that there may be substantial capacitive loading or other loading on the conductors supplying such signals, and such loading may significantly alter the accuracy of the timing signals.

U.S. Pat. No. 3,206,686 discloses a delay time controller including a variable delay line connected in a loop with a phase discriminator and an amplifier that form a phase-locked loop. However, this reference does not disclose multiple delay line outputs, and cannot be used to generate a plurality of related timing signals. U.S. Pat. No. 4,494,021 discloses a circuit including a delay line. A circuit is disclosed to generate a control voltage that drives the tapped delay line, and the delay of individual elements of the delay line are controlled. A phase locked loop circuit generates the control voltage, but the delay line is not included in the phase locked loop. Accuracy of the delay of individual delay elements in the delay line requires precise matching between a voltage controlled oscillator and the delay line to ensure that delay per cell is as desired.

SUMMARY OF THE INVENTION

Accordingly, it is an object of the invention to avoid the need to derive high resolution timing signals from high frequency clock signals.

It is another object of the invention to provide a timing generator that avoids the need to utilize an input clock frequency which determines the resolution of edges of the various timing signals generated thereby.

It is another object of the invention to provide an analog timing generator suitable for use in CMOS circuitry.

It is another object of the invention to generate timing pulses the widths of which are relatively independent of absolute values of capacitors or current sources.

It is another object of the invention to provide an analog timing generator that produces pulses having the width determined by the ratios of capacitors.

It is another object of the invention to provide an analog timing generator circuit that produces pulses with the accuracy and width of which are substantially independent of circuit loading on conductors carrying the timing pulses.

Briefly described, and in accordance with one embodiment thereof, the invention provides a circuit for generating a plurality of timing signals. The circuit includes a plurality of cascade-connected delay cells, each having an input coupled to an output of another, and a plurality of latches each having a set input, a set inhibit input, a reset input, and an output. A set input of one of the latches is coupled to an output of one of the delay cells to determine a time of occurrence of a leading edge of a timing pulse produced at the output of that latch. A reset input of that latch is coupled to an output of a subsequent delay cell to determine a time of occurrence of a trailing edge of the same timing pulse. The circuit includes a phase detector having a first input coupled to receive a clock signal and a second input coupled to an output of one of the delay cells to receive a signal indicative of propagation of a logic state through a plurality of the delay cells. The phase detector includes circuitry for producing an adjustment signal indicative of whether the phase of the indicator signal is ahead of or behind the phase of the clock signal. The clock signal initiates propagation of the logic state through the delay cells. Each of the delay cells increases or decreases propagation time through that delay cell in response to the adjustment signal, so as to cause a time required for the logic state to propagate through all of the delay cells up to and including the cell generating the signal indicative of propagation of the logic state through the cells to be equal to a period of the clock signal. Each of the delay cells includes a first inverter connected in series with a current source and a capacitor connected to determine a turn-on delay of that delay cell, and a second inverter having an input connected to an output of the first inverter and producing a relatively steep output signal rise time. In one embodiment of the invention, an output of one of the delay cells is connected to the set inhibit input of a first one of the latches and the set input of a second of the latches. The output of the first latch is connected to the set inhibit input of the second latch, to prevent capacitive or other loading of the output of the first latch from causing overlap between timing pulses produced at the outputs of the first and second latches.

BRIEF DESCRIPTION OF THE DRAWINGS

FIG. 1A is a block diagram of a circuit useful in explaining the operation of the circuit of FIG. 1.

FIG. 1B is a timing diagram useful in explaining the operation of the circuit of FIG. 1A.

FIG. 2 is a schematic diagram of the basic timing cell included in the analog timing generator of FIG. 1.

FIG. 8 is a logic diagram illustrating generation of load-independent timing pulses in the circuit of FIG. 1.

DETAILED DESCRIPTION OF THE PREFERRED EMBODIMENT

Figure 1:
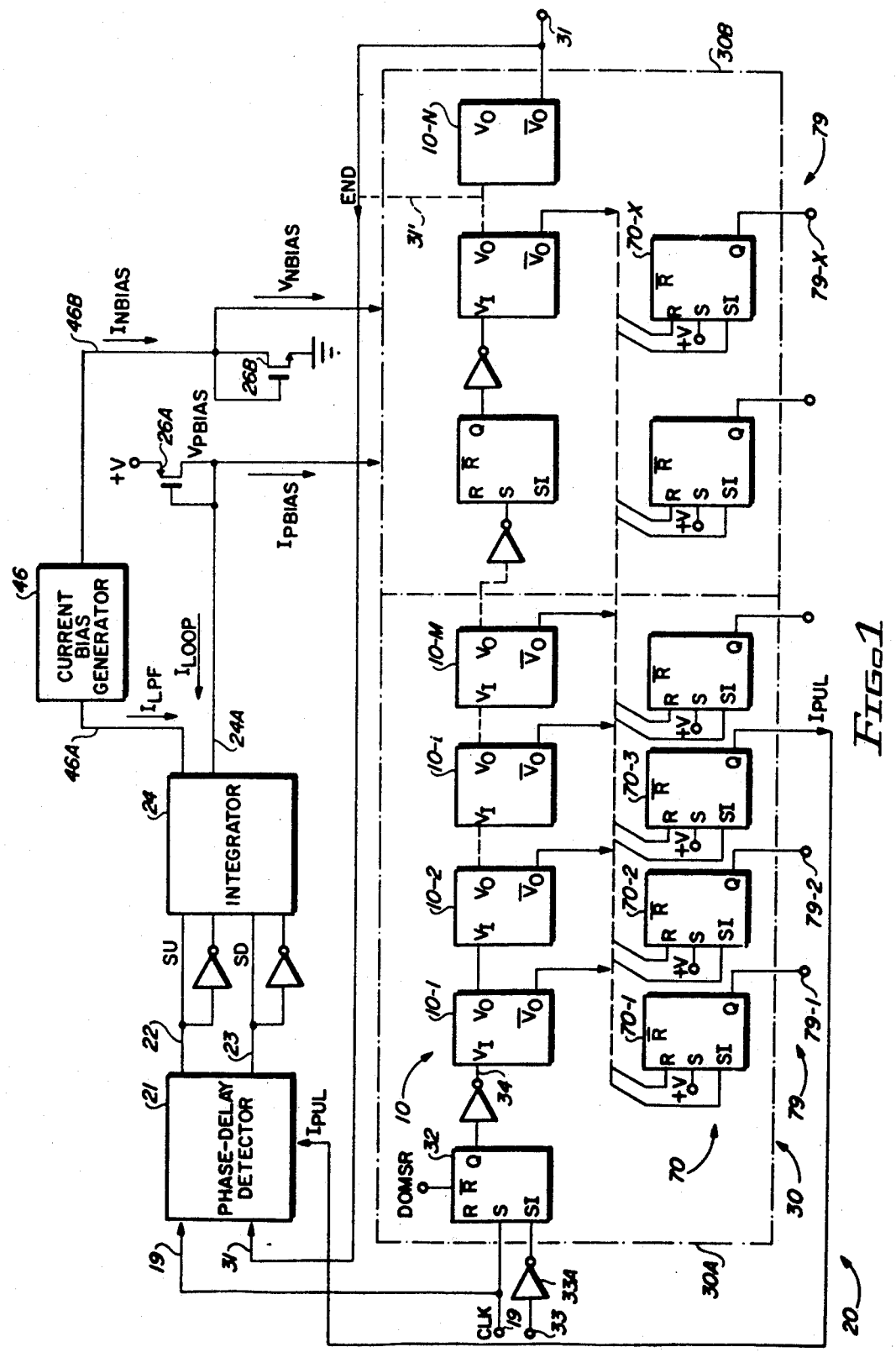
FIG. 1 is a block diagram illustrating the analog timing generator of the present invention.

Referring first to FIG. 2, the present invention utilizes a chain of delay cells connected together in a cascaded configuration. The basic delay cell 10 includes a CMOS inverter including a P channel MOSFET 11 and an N channel MOSFET 12 each having its drain connected to an output conductor 10A on which an output signal $V_{OA}$ is produced. The gate electrode of MOSFET 12 is connected to an input conductor 10B on which an input signal $V_1$ is applied. The source of MOSFET 11 is coupled to $+V$ through a current source $I_1$. The source of N channel MOSFET 12 is coupled through a current source $I_2$ to $-V$. A capacitor $C_O$ is connected to output conductor 10A. Output conductor 10A also is connected to the input of a CMOS inverter 13, the output of which is connected by conductor 14 to the input of another CMOS inverter 15 in the cascaded configuration. The output of CMOS inverter 15 also is connected by conductor 16 to timing circuitry shown in FIG. 1. (Note that delay cells 10 also can be used with $V_{OA}$ held at a high level and then pulled low to the trip point of inverter 13 by providing a slightly modified connection of output inverters.)

Figure 3:
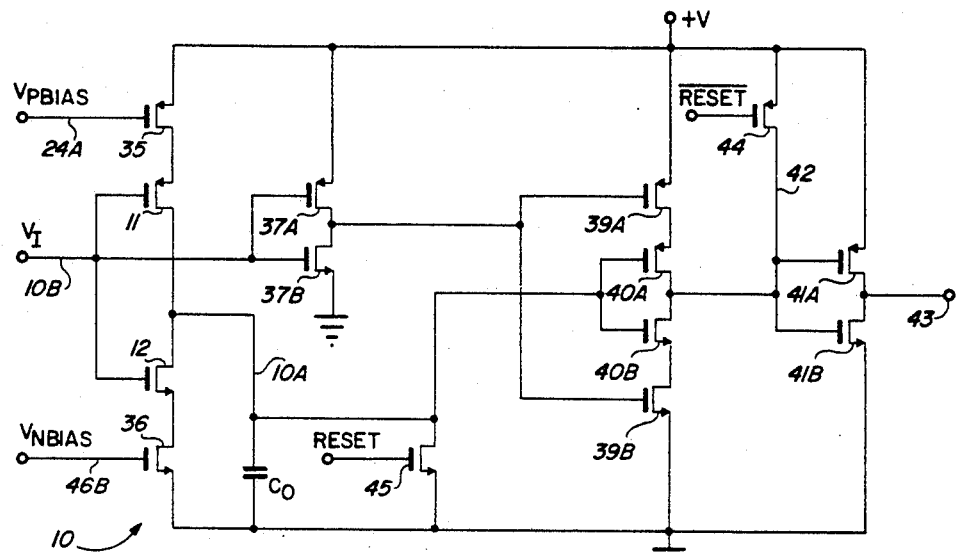
FIG. 3 is a detailed circuit schematic diagram of an implementation of the cell of FIG. 2.

Each cell 10 functions as a delay element. The amount of time required for the current $I_1$ to charge the voltage $V_{OA}$ on the output conductor 10A from $-V$ volts to the trip point of inverter 13 is the turn-on delay of that cell. The amount of time required for the current $I_2$ to discharge capacitor $C_O$ from $+V$ volts to the trip point of inverter 13 is the turn-off delay. A detailed implementation of delay cell 10 is shown in FIG. 3, subsequently described.

Referring next to FIG. 1, analog timing generator 20 of the present invention includes the above-mentioned cascaded connection of individual delay cells 10 including delay cells 10-1, 10-2 ... 10-N in block 30. Block 30 also includes a plurality of latches 70-1, 70-2...70-X. The clock signal CK is applied to the S (Set) input of latch 32. A control signal is applied to conductor 33 by an inverter 33A to the SI (Set Inhibit) input of latch 32. The signal on conductor 33 controls the time of occurrence of the beginning of the cycle in which various timing pulses are generated by analog timing generator 20. The $\overline{R}$ (Reset) input of latch 32 is connected to receive a signal DOMSR, which represents a reset input to the group of cells contained in subsection 30A of section 30, subsequently described. The Q output of latch 32 is inverted and applied to the $V_I$ input voltage of the first delay cell 10-1 by means of conductor 34. The $\overline{V}_O$ output of the last delay cell 10-N is connected to conductor 31. The various timing signals produced by analog timing generator 1 are generated on the outputs of latches 70-1, 70-2, designated by numerals 79-1, 79-2, etc.

It should be noted that the connections between the outputs of delay cells 10-1, 10-2, and the inputs of latches 70-1, 70-2 . . . to the various delay cell outputs may be better understood if the basic structure and operation of the delay cells and latches are understood. The structure and operation of these circuits is described later with reference to FIGS. 3 and 4.

The connection of the $\overline{V}_O$ outputs of the delay cells 10 in block 30 of FIG. 1 to the inputs of the various latches 70 are determined by the desired times of occurrence of the leading and trailing edges of the timing pulses produced on the various latch output conductors 79. The connections referred to also are determined by the amount of impedance or capacitive loading produced on those latch output conductors by external circuitry (not shown) that receives the timing pulses. Either of the S and SI inputs of each latch 70 can be thought of as a set input and the other as a set inhibit input.

Each latch has one of its set inputs connected to the $\overline{V}_O$ output of a delay cell 10, the $\overline{V}_O$ output of which goes positive at the desired time of the leading edge of a timing pulse produced by that latch. Each latch 70 has its reset input connected to the $\overline{V}_O$ output of delay cell 10, the $\overline{V}_O$ output of which goes positive at the desired time of the trailing edge of the timing pulses produced at the output of that latch.

For example, in FIG. 1A, the $\overline{V}_{01}$ signal is produced on the output of latch 10-A is connected to the SI input of a particular latch 70-K. The set input of latch 70-K is connected to +5 volts. The time of occurrence of the leading edge of $\overline{V}_{01}$ determines the time of occurrence of the leading edge of the timing signal produced on the Q output of latch 70-K. A subsequent delay element 10-J produces a signal $\overline{V}_{OJ}$ on its $\overline{V}_O$ output and applies it to the R input of latch 70-K. The leading edge of $\overline{V}_{OJ}$ determines the time of occurrence of the trailing edge of the Q pulse produced at the output of latch 70-K, as shown in the timing diagram of FIG. 1B.

The set inhibit input of each latch can be connected to a signal or level that ensures the latch is set at the proper time by the set input. In some cases, the set inhibit input is connected to a signal or level that ensures that a trailing edge of the timing pulse produced by that latch will not overlap the leading edge of another timing pulse produced by another latch 70. Such overlap can arise if there is heavy capacitive or impedance loading that delays the trailing edge of the timing pulse being referred to.

For example, in FIG. 8 a typical connection of delay cells 10-A and 10-B and latches 70-E and 70-F is shown. Output 79-E may be heavily capacitively loaded. It is assumed for the present discussion that the trailing edge of the timing pulse produced by latch 70-E is never to overlap the leading edge of the timing pulse produced by latch 70-F on conductor 79-F, regardless of whether the capacitance $C_O$ is very small or very large.

To achieve this, the $\overline{V}_O$ output of delay cell 10-A is connected to the SI and S inputs of latches 70-E and 70-F, respectively. The S input of latch 70-E is connected to +V. The output of latch 70-E is connected to the SI input of latch 70-F. The reset inputs of latch 70-E is connected to the $\overline{V}_O$ output of delay cell 10-B, which goes to a high level during the desired trailing edge time of the timing pulse produced by latch 70-E.

Referring back to FIG. 1, conductor 31, which carries the signal END from the last cell 10-N of the delay line, is connected to one input of a phase-delay detector circuit 21. The CK signal is connected to the other input of phase detector 21. The output 23 of phase-delay detector circuit 21 produces a "slow down" signal SD, which is applied to another input of integrator or "loop filter" circuit 24. Output 22 of phase detector 21 is a "speed up" signal SU, which is connected to an input of integrator circuit 24.

An output 24A of integrator 24 is connected to the gate and drain electrodes of a P channel MOSFET 26A, the source of which is connected to +V. A current $I_{LOOP}$ flows through conductor 24A as illustrated, and a voltage $V_{PBIAS}$ is applied by conductor 24A to control the current sources $I_1$ in the respective delay cells, as subsequently explained with reference to FIG. 3. (It should be appreciated that pulse widths produced at the outputs of the various delay cells 10-1, 10-2, etc. also can be controlled by scaling the $I_1$ current in each cell 10 with a fixed capacitor, or by a combination of scaling the I1 currents and the capacitors.) MOSFET 26B is driven by a current source to control the reset current and I2 currents in the delay cells. Conductor 46B applies a voltage $V_{NBIAS}$ to control the I2 current sources in each of the delay cells.

Phase-delay detector circuit 21 forces the sum of all (or fewer than all) of the delays of cells 10-1 ... 10-N to be equal to one clock period of the input clock signal CK, as subsequently explained. The delay through each of delay cells 10 therefore is forced by the phase-locked loop formed by phase-delay detector 21, circuit 30, and integrator 24 to be determined by the ratios of the various capacitors $C_O$. Since the capacitances of present CMOS manufacturing processes can be accurately ratioed, high accuracy of the times of occurrence of the leading and trailing edges of the timing signals on conductors 79 in FIG. 1 is achieved without providing a high frequency input clock.

Current bias generator circuit 46 produces a current $I_{LPF}$ in conductor 46A which is applied to the input of integrator 24. Current bias generator circuit 46 produces an output current in conductor 46B, which is connected to the drain and gate electrodes of N channel MOSFET 26B.

Figure 7:
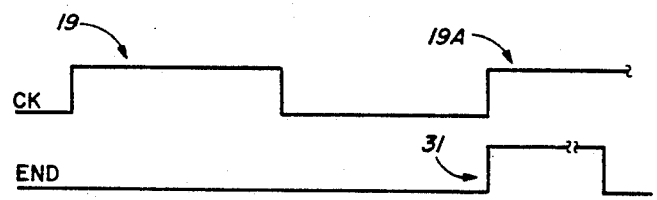
FIG. 7 is a timing diagram useful in describing the operation of the system of the analog timing generator of FIG. 1.

FIG. 7 shows the CK waveform on conductor 19 and the END pulse on conductor 31. The leading edge of CK starts the propagation of "1"s through delay element 10. The SU and SD pulses adjust the bias currents $I_1$ of each delay cell until the leading edge of the END pulse on conductor 31 coincides with the leading edge of the next CK pulse 19A.

Referring next to FIG. 3, which shows a detailed implementation of the circuit for the delay cell 10, the input voltage $V_1$ is applied by conductor 10B to the gate electrodes of P channel MOSFETs 11 and 37A and N channel MOSFETs 12 and 37B. The drains of MOSFETs 11 and 12 are connected by conductor 10A to capacitor $C_O$ and to the gates of P channel MOSFET 40A and N channel MOSFET 40B. The source of MOSFET 11 is connected to the drain of P channel MOSFET 35, the source of which is connected to +V. The gate of MOSFET 35 is connected by conductor 24A to receive a bias voltage $V_{PBIAS}$, which is used to control the delay of all of the delay cells 10. The gate electrode of current source MOSFET 36 is connected by conductor 46B to receive a bias voltage $V_{NBIAS}$.

The sources of MOSFETs 37A and 37B are connected to +V and ground, respectively, and their drains are connected by conductor 38 to the gate electrodes of P channel MOSFET 39A and N channel MOSFET 39B. The source of MOSFET 39A is connected to +V, and the source of MOSFET 39B is connected to ground. The drain of MOSFET 39B is connected to the source of N channel MOSFET 40B. The drain of MOSFET 39A is connected to the source of P channel MOSFET 40A. The drains of MOSFETs 40A and 40B are connected by conductor 42 to the gate electrodes of P channel MOSFET 41A and N channel MOSFET 41B. The voltage $V_O$ appears on conductor 42. The sources of MOSFETs 41A and 41B are connected to +V and ground, respectively, and their drains are connected by conductor 43 to conduct $\overline{V}_O$ on conductor 43. A P channel MOSFET 44 has its drain connected to the gates of MOSFETs 41A and 41B, its source connected to +V, and its gate connected to receive the signal $\overline{RESET}$.

Conductor 10A is coupled by N channel MOSFET 45 to ground, and the gate of MOSFET 45 is connected to receive the signal RESET.

In operation, when V undergoes a transition from +5 volts to 0 volts, MOSFET 11 of delay cell 10 produces a relatively slow increasing signal $V_{OA}$ on conductor 10A wherein the charging time is determined by $I_1$ and $C_O$. The inverter including MOSFETs 40A and 40B does not have a large capacitive load on its output conductor 42, so a steep transition from a "1" level to a "0" level or vice versa appears on conductor 42 when the appropriate trip point of the inverter 40A, 40B is reached by the signal $V_{OA}$. MOSFETs 39A and 39B are connected in series with CMOS inverter 40A, 40B in order to prevent a condition in which there is a low resistance path between +V and ground through MOSFETs 39A, 40A, 40B, and 39B because inverter 37A, 37B produces a steep, fast transition on conductor 38 turning one of MOSFETs 39A and 39B off and the other on well before the signal on conductor 10A reaches a trip point of inverter 40A, 40B. Inverter 41A or 41B produces a sharp transition of $\overline{V}_O$.

The cell is reset when the gate of MOSFET 45 receives a high signal on its gate, pulling the voltage on conductor 10A to ground. This sets $V_O$ high, enabling MOSFET 36 of the next delay cell. MOSFET 45 is used to provide rapid resetting of the delay cell while MOSFET 36 is used to keep the cell in the reset state after RESET has been removed until $V_I$ goes from a high level to a low level.

Figure 4:
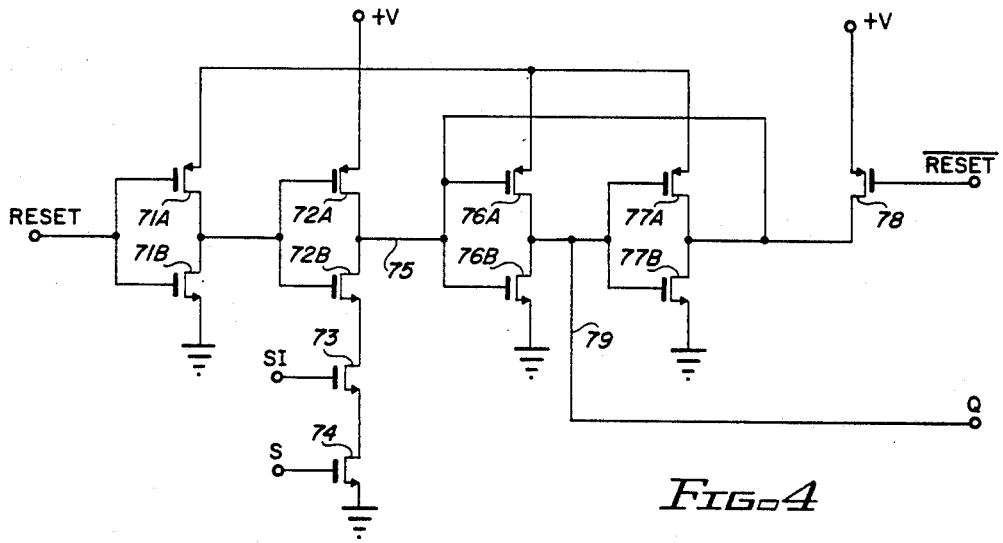
FIG. 4 is a schematic diagram of latch circuits included in the block diagram of FIG. 1.

Referring to FIG. 4, each of latch circuits 70-1 ... 70-X in FIG. 1 includes a CMOS inverter 71A, 71B receiving a RESET input signal and producing an output signal that is applied to the input of a CMOS inverter 72A, 72B. The source of N channel MOSFET 72B is connected by the series connection of N channel MOSFETs 73 and 74 to ground. The signal SI (Set Inhibit) is applied to a gate of MOSFET 73 and the signal S (set) is applied to the gate of MOSFET 74. The output of inverter 72A, 72B is applied by conductor 75 to the input of CMOS inverter 76A, 76B to the output of CMOS inverter 77A, 77B, and to the drain of P channel MOSFET 78, the source of which is connected to +V. RESET is applied to the gate of MOSFET 78. The output of inverter 76A,76B is applied by conductor 79 to the Q output of latch 70 and to the input of inverter 77A,77B.

If RESET is equal to a "1", P channel MOSFET 72A is turned on, pulling conductor 75 high, causing Q to be equal to a "0". This causes P channel MOSFET 77A to be on, tending to pull conductor 75 to a high level, latching a "0" in the latch section formed by inverters 76A, 76B and 77A, 77B. The complementary level of $\overline{\text{RESET}}$ is equal to a "0" and turns on P channel MOSFET 78, producing the same effect.

If RESET is equal to a "0", and S is equal to a "1", then the condition SI equals "1" turns on MOSFET 73. MOSFET 72B is turned on by inverter 71A, 71B, pulling conductor 75 low, producing a "1" at the output of inverter 76A, 76B and causing Q to equal a "1". Inverter 77A latches the "1" into the latch section of circuit 70.

Figure 5:
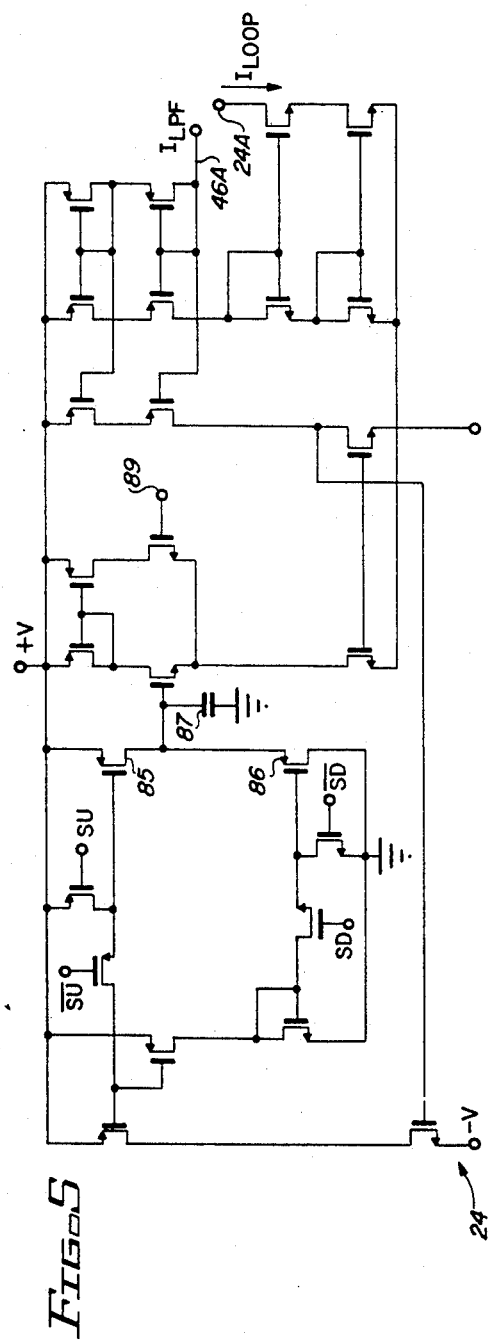
FIG. 5 is a detailed circuit diagram of a filter circuit utilized in the diagram of FIG. 1.

The details of the integrator circuit 24 are shown in FIG. 5. This circuit receives speed up signal SU and its complement and slow down signal SD and its logical complement, and produces the bias current signal $I_{LOOP}$ in conductor 24A and the current $I_{LPF}$ in conductor 46A. A DC reference voltage is applied to conductor 89.

The implementation of integrator circuit 24 is relatively straightforward, and need not be described in detail, except to note that it performs the function of controlling the dynamic behavior of the loop. It should be appreciated that various other integrator circuits could be utilized instead of the one shown in FIG. 5.

MOSFET 26A of FIG. 1 converts $I_{LOOP}$ into the voltage $V_{PBIAS}$ applied to the gate electrode of MOSFET 35 of each delay cell 10 (FIG. 3). Similarly, MOSFET 26B converts the current $I_{NBIAS}$ to the bias voltage $V_{NBIAS}$ applied to the gate of the N channel MOSFET 36 of each delay cell 10.

Figure 6:
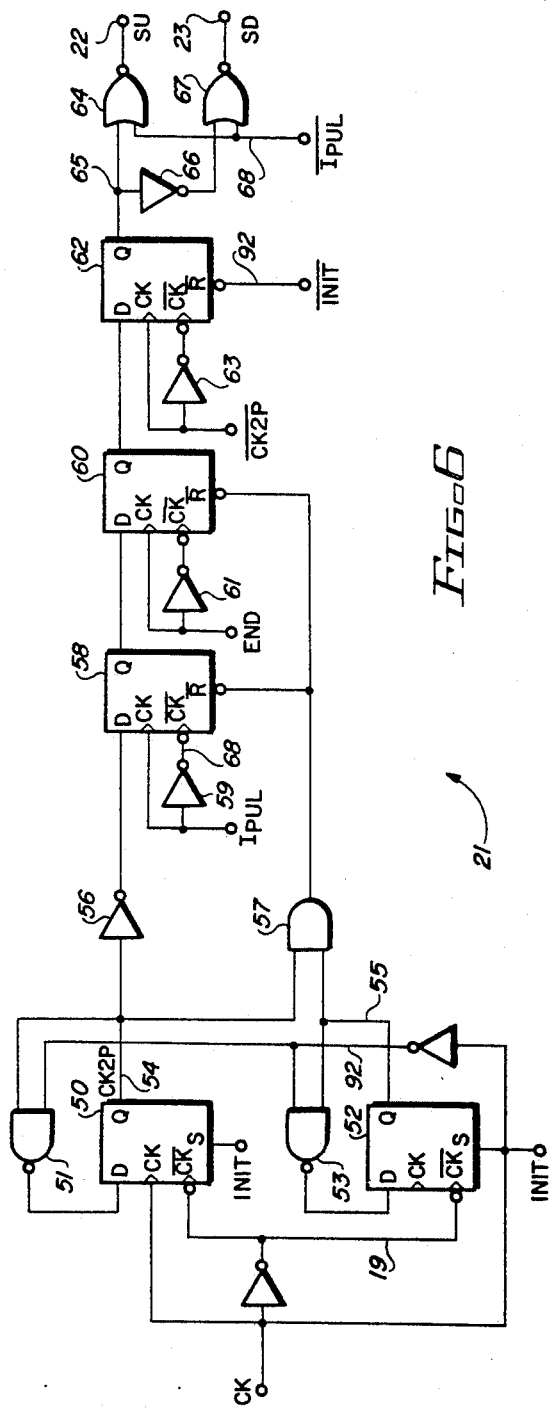
FIG. 6 is a detailed diagram of the phase detector circuit included in FIG. 1.

Referring to FIG. 6, which shows phase detector 21, the CK signal is applied to the clock input of a D type flip-flop 50. The D input of flip-flop 50 is connected to the output of NAND gate 51, which has one input connected to the Q output of the flip-flop 50 by means of conductor 54. Conductor 54 also is connected to an input of inverter 56 and two input NAND gate 57. CK conductor 19 also is connected to the $\overline{\text{CK}}$ input of D type flip-flop 52. The D input of flip-flop 52 is connected to the output of two input NAND gate 53, one input of which is connected by conductor 55 to the Q output of flip-flop 52 and to the other input of NAND gate 57. The signal INIT is connected to the S (set) inputs of flip-flops 50 and 52. The complement of INIT is coupled to the second input of each of NAND gates 51 and 53.

The output of inverter 56 is connected to the D input of D type flip-flop 58, the Q output of which is connected to the D input of D type flip-flop 60. The clock input of flip-flop 58 is connected to the output of inverter 59, the input of which receives the current pulse signal IPUL from block 30 of FIG. 1. The IPUL voltage pulse is used to drive a charge pump that can be included in the integrator circuit which is part of the low pass filter 24 of FIG. 5. In this case, IPUL gates the SU and $\overline{\text{SU}}$ pulses of FIG. 5. (Other implementations of the low pass filter/integrator circuit can be easily utilized which do not require IPUL, however.) The signal CK2P is produced on conductor 54 by D type flip-flop 50.

The signal IPUL is connected to the $\overline{\text{CK}}$ input of flip-flop 58. The CK and $\overline{\text{CK}}$ inputs of flip-flop 60 are connected to the END and $\overline{\text{END}}$ signals. The Q output of flip-flop 60 is connected to the D input of D type flip-flop 62, the Q output of which is connected by conductor 65 to one input of NOR gate 64 and to an input of inverter 66. The CK and $\overline{\text{CK}}$ inputs of flip-flop 62 are connected to receive the signals CK2P and $\overline{\text{CKCP}}$ respectively. The $\overline{\text{R}}$ inputs of flip-flops 58 and 60 are connected to the output of NAND gate 57. The $\overline{\text{R}}$ input of flip-flop 62 is connected to receive the $\overline{\text{INIT}}$ signal. The $\overline{\text{IPUL}}$ signal is applied to the other input of NOR gate 64 and to one input of NOR gate 67. The other input of NOR gate 67 is connected to the output of inverter 66. The output of NOR gate 64 produces the speed up pulse SU on conductor 22. The output of NOR gate 67 produces the slow down pulse SD on conductor 23.

Phase detector 21 uses an entire CK period to determine if an IPUL pulse and an END pulse occur during that CK period, and if that is the case, then the SD (slow down) pulse is produced. Otherwise, the SU (speed up) pulse is produced on conductor 22. The INIT initialization pulse occurs only during a power on reset operation.

The first step in the operation of phase detector 21 is to reset flip-flops 58 and 60. Then the effect of gate 57 and flip-flops 58, 60, and 62 is to detect the condition that a leading edge of an IPUL pulse is followed by a leading edge of the END signal. Detecting of this condition is accomplished in response to a "1" at the output of inverter 56 being latched into flip-flop 58. That "1" on the leading edge of the END pulse is latched into flip-flop 60. If the "1" at the output of flip-flop 60 is latched before the trailing edge of the signal $\overline{\text{CK2P}}$, then a "1" is latched into flip-flop 62, indicating by the resulting signal on conductor 65 that an SD (slow down) pulses is needed to increase the propagation time through the delay cells 10. Otherwise, a "0" remains in flip-flop 62, causing an SU (speed up) pulse to decrease the propagation time through delay cells 10.

In order to prevent the circuit of FIG. 1 from producing two sets of pulses for a single rising edge of CK, section 30 can be divided into two sections, so that while the first section is outputting various timing pulses, the next section is being reset. The splitting of "domino" section 30 into subsections 30A and 30B is made in order to ensure that the full device propagation time fits within a single period of clock signal CK. A signal for resetting subsection 30B while propagation of a "1" is occurring in subsection 30A is derived within section 30A by using a selected latch output and gating it to the $\overline{\text{R}}$ inputs of the delay cells 10 in subsection 30B. Conversely, a signal for resetting section 30A while propagation is occurring in subsection 30B is derived is section 30B by taking the output of a selected latch in section 30B and gating it to the $\overline{\text{R}}$ inputs of the delay cells 10 in subsection 30A.

It is possible for an END signal to be produced before CK has gone from a high to a low level if propagation through the "domino" circuit 30 is too fast. The only time this can occur is if propagation through the "domino" section 30 is too fast and SD pulses are needed. The circuit of FIG. 6 is designed to ignore multiple IPUL and END pulses during the same CK period.

The above described analog timing generator circuit should be very useful in CMOS analog-to-digital converters in which the various bits have various settling times, the most significant bit having the longest settling time, and successively lower significant bits having shorter settling times. The necessary timing signals can be conveniently optimized to the settling times of each stage by using the analog timing generator circuit of FIG. 1, instead of requiring all of the stages to have the same timing even though the less significant bit stages have shorter settling times.

While the invention has been described with reference to several particular embodiments thereof, those skilled in the art will be able to make the various modifications to the described embodiments of the invention without departing from the true spirit and scope of the invention. It is intended that all combinations of elements and steps which perform substantially the same function in substantially the same way to achieve the same result are within the scope of the invention. For example, it may be very useful to extend domino cells beyond the END (DOME) signal, e.g., for timing recovery. This is no reason why the END signal cannot be produced by an intermediate cell as indicated by dotted line 311 in FIG. 1.

What is claimed is:

1. A circuit for generating a plurality of timing signals, comprising in combination:
   (a) a plurality of cascade-connected delay cells, each except a first one having an input coupled to an output of another;
   (b) a plurality of latches each having set input, a reset input, and an output;
   (c) first means for coupling a set input of any one of the latches to an output of one of the delay cells to determine a time of occurrence of a leading edge of a timing pulse produced at the output of that latch;
   (d) second means for coupling a reset input of any one of the latches to an output of one of the delay cells to determine a time of occurrence of a trailing edge of a timing pulse produced at the output of that latch;
   (e) a phase detector having a first input coupled to receive a clock signal and a second input coupled to an output of one of the delay cells to receive a signal indicative of propagation of a logic state through a predetermined number of the delay cells, and means in the phase detector for producing an adjustment signal indicative of whether the phase of the indicating signal is ahead of or behind the phase of the clock signal;
   (f) means responsive to the clock signal for initiating propagation of the logic state through the delay cells; and
   (g) means in each of the delay cells for increasing or decreasing a delay of that delay cell in response to the adjustment signal to cause a time required for the logic state to propagate through the predetermined number of the delay cells to bee equal to a period of the clock signal.

2. A circuit for generating a plurality of timing signals, comprising in combination:
   (a) a plurality of cascade-connected delay cells, each except a first or having an input coupled to an output of another;
   (b) a plurality of latches each having a set input, a reset input, and an output;
   (c) first means for coupling a set input of a first latch to an output of a first delay cell to determine a time of occurrence of a leading edge of a timing pulse produced at the output of the first latch;
   (d) second means for coupling a reset input of the first latch to an output of a second delay cell to determine a time of occurrence of a trailing edge of a timing pulse produced at the output of the first latch;
   (e) a phase detector having a first input coupled to receive a clock signal and a second input coupled to an output of a second delay cell to receive a signal indicating propagation of a logic state through the first and second delay cells, and means in the phase detector for producing an adjustment signal indicative of whether the phase of the indicating signal is ahead of or behind the phase of the clock signal;
   (f) means responsive to the clock signal for initiating propagation of the logic state through the delay cells; and
   (g) means in each of the delay cells for increasing or decreasing a delay of that delay cell in response to the adjustment signal to cause a time required for the logic state to propagate through the predetermined number of the delay cells to be equal to a period of the clock signal.

3. The circuit of claim 2 wherein each of the delay cells includes a first inverter having an input, the first inverter being connected in series with a current source, and a capacitor connected to an output of the first inverter to determine a turn-on delay of that delay cell, and a second inverter having an input connected to an output of the first inverter and producing a relatively steep output signal rise time.

4. The circuit of claim 3 wherein the second inverter is connected in series with a first P channel MOSFET and a first N channel MOSFET, that delay cell including a third inverter having an input connected to the input of that delay cell and an output connected to gate electrodes of the first P channel MOSFET and the first N channel MOSFET.

5. The circuit of claim 4 wherein the delay cell includes a fourth inverter having an input connected to an output of the second inverter, and means coupled to the input of the fourth inverter for producing a reset state on an output of the fourth inverter.

6. The circuit of claim 2 wherein the phase detector includes means for detecting whether a leading edge of the indicating signal does not occur within the period of the clock signal and causing the adjustment signal to increase the delay of each of the delay cells.

7. The circuit of claim 1 wherein both the first latch and a second latch each have a set inhibit input and the second latch has a reset input, the output of the first delay cell being connected to the set inhibit input of one of the first and second latches and the reset input of the other of the first and second latches, to prevent overlap of timing pulses produced at the outputs of the first and second latches despite heavy loading of the output of the first latch.

8. The circuit of claim 2 including an integrating circuit that receives the adjustment signal and integrates it to produce a control signal, and means for applying the control signal to each of the delay cells.

9. The circuit of claim 2 wherein the indicating signal is produced on the output of a last of the cascade-connected delay cells.

10. The circuit of claim 2 wherein the indicating signal is produced on the output of one of the cascade-connected delay cells other than a last one.

11. The circuit of claim 2 wherein each of the latches includes a P channel first MOSFET, an N channel second MOSFET, a P channel third MOSFET, an N channel fourth, fifth, sixth MOSFETs, a P channel seventh MOSFET, an N channel eighth MOSFET, a P channel ninth MOSFET, an N channel tenth MOSFET, and a P channel eleventh MOSFET, gates of the first and second MOSFETs being connected to the reset input, drains of the first and second MOSFETs being connected to gates of the third and fourth MOSFETs, drains of the third and fourth MOSFETs being connected to gates of the seventh and eighth MOSFETs and to drains of the ninth and tenth MOSFETs, the drains of the seventh and eighth MOSFETs being connected to the output and to gates of the ninth and tenth MOSFETs, the source of the fourth MOSFET being connected to a drain of the fifth MOSFET, a gate of the fifth MOSFET being connected to a set inhibit input, a source of the fifth MOSFET being connected to a drain of the sixth MOSFET, a gate of the sixth MOSFET being connected to the set input, a source of the sixth MOSFET being connected to ground, source of the second, eighth, and tenth MOSFETs being connected to ground, source of the first, third, seventh, and ninth MOSFETs being connected to a positive supply voltage conductor.

12. The circuit of claim 11 including an eleventh MOSFET having a gate connected to the reset input, a source connected to the positive supply voltage conductor, and a drain connected to the drains of the ninth and tenth MOSFETs.

13. A circuit for generating a plurality of timing signals, comprising in combination:
(a) a tapped delay line having a plurality of sequentially connected delay sections, each having a corresponding output;
(b) first means for determining a time of occurrence of a leading edge of a timing signal in response to an output of one of the delay sections;
(c) second means for determining a time of occurrence of a trailing edge of a timing signal in response to an output of another of the delay sections;
(d) a phase detector having a first input coupled to receive a clock signal and a second input coupled to an output of a section of the delay line to receive a signal indicating propagation of a logic state through the section of the delay line, and means in the phase detector for producing an adjustment signal indicative of whether the phase of the indicating signal is ahead of or behind the phase of the clock signal;
(e) means responsive to the clock signal for initiating propagation of the logic state through the delay line; and
(f) means in each of the plurality of sequentially connected delay sections for increasing or decreasing a delay of that sections in response to the adjustment signal to cause a time required for the logic state to propagate through the sequentially connected delay sections to be equal to a period of the clock signal.

14. A method for generating a plurality of timing signals, comprising steps of:
(a) initiating propagation of a logic state through a tapped delay line having a plurality of outputs in response to a clock signal;
(b) producing a signal indicating completion of propagation of the logic state through a predetermined portion of the delay line;
(c) operating a phase detector having a first input coupled to receive the clock signal and a second input coupled to receive the indicating signal to produce an adjustment signal indicative of whether a phase of the indicating signal is ahead of or behind a phase of the clock signal; and
(d) increasing or decreasing a delay of the delay line in response to the adjustment signal to cause a time required for the logic state to propagate through the predetermined portion of the delay line to be equal to a period of the clock signal,
wherein the delay line includes a plurality of cascade-connected delay cells each except a first one having an input coupled to an output of another and a plurality of latches each having a set input, a reset input, and an output, the method including steps of coupling a set input of a first latch to an output of a first delay cell to determine a time of occurrence of a leading edge of a timing pulse produced at the output of the first latch, and coupling a reset input of the first latch to an output of a second delay cell to determine a time of occurrence of a trailing edge of a timing pulse produced at the output of the first latch.

15. The method of claim 14 wherein the delay line includes a plurality of cascade-connected delay cells each except a first one having an input coupled to an output of another and a plurality of latches each having a set input, a reset input, and an output, the method including the steps of coupling a set input of a first latch to an output of a first delay cell to determine a time of occurrence of a leading edge of a timing signal produced at the output of the first latch, and coupling a reset input of the first latch to an output of a second delay cell to determine a time of occurrence of a trailing edge of a timing signal produced at the output of the first latch.

16. The method of claim 15 including operating a phase detector to detect whether a leading edge of the indicating signal does not occur within the period of the clock signal and causing the adjustment signal to vary the delay of each of the delay cells.

17. The method of claim 16 wherein both the first latch and a second latch each have a set inhibit input and a second latch has a reset input, the method including coupling an output signal of a first delay cell to the set input of one of the first and second latches and the reset input of the other of the first and second latches to thereby prevent overlapping of timing pulses produced at the outputs of the first and second latches despite heavy loading of the output of the first latch.

* * * * *